(12) United States Patent
Reynolds et al.

(10) Patent No.: US 8,343,802 B2
(45) Date of Patent: Jan. 1, 2013

(54) ENCAPSULATION FOR ELECTRONIC AND/OR OPTOELECTRONIC DEVICE

(75) Inventors: Kieran Reynolds, Cambridge (GB); William Reeves, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 589 days.

(21) Appl. No.: 12/373,377

(22) PCT Filed: Jul. 18, 2007

(86) PCT No.: PCT/GB2007/002710
§ 371 (c)(1), (2), (4) Date: Mar. 19, 2009

(87) PCT Pub. No.: WO2008/009929
PCT Pub. Date: Jan. 24, 2008

(65) Prior Publication Data
US 2010/0001307 A1 Jan. 7, 2010

(30) Foreign Application Priority Data
Jul. 19, 2006 (GB) .................................. 0614341.6

(51) Int. Cl.
*H01L 21/00* (2006.01)
(52) U.S. Cl. ....................... 438/106; 438/121
(58) Field of Classification Search .......... 438/106–127
See application file for complete search history.

(56) References Cited

U.S. PATENT DOCUMENTS

| 2002/0113549 A1 | 8/2002 | Yamazaki et al. |
| 2003/0027369 A1 | 2/2003 | Yamazaki |
| 2004/0018364 A1 | 1/2004 | Ota et al. |
| 2005/0249901 A1 | 11/2005 | Yializis et al. |
| 2006/0226523 A1* | 10/2006 | Foust et al. ................ 257/680 |

FOREIGN PATENT DOCUMENTS

| EP | 1 662 573 A2 | 5/2006 |
| WO | 2006/107379 A1 | 10/2006 |

OTHER PUBLICATIONS

European Search Report (corresponding to EP Application No. 07 766278.1, dated Nov. 9, 2011).

* cited by examiner

*Primary Examiner* — Telly Green
(74) *Attorney, Agent, or Firm* — Sughrue Mion, PLLC (57) ABSTRACT

A method of processing a flexible encapsulation scheme to encapsulate a flexible device, such as a display device in order to provide structural support for the display module. An upper transparent encapsulation layer covers and protects the media and active area of the device. A lower encapsulation layer is deposited over the under side of the display to complete the encapsulation and the two protective encapsulation layers are sealed. A driver housing may be positioned at the opposite end of the device to the overlap region of the encapsulation layers in order to protect the driver electronics.

8 Claims, 11 Drawing Sheets

ENCAPSULATION FOR ELECTRONIC AND/OR OPTOELECTRONIC DEVICE

The present invention relates to a technique of encapsulating one or more electronic and/or optoelectronic device elements supported on a substrate. In one embodiment, it relates to a method of encapsulating a flexible electronic device to seal the device and protect from degradation due to ultraviolet radiation, moisture or oxygen ingression.

For many flat-panel display technologies the display medium, such as liquid crystal, electrophoretic or organic light-emitting diode display elements, or the active-matrix thin-film transistors (TFTs) driving the display medium, such as inorganic amorphous silicon, polycrystalline silicon or organic TFTs can require protection from certain species in the atmosphere such as humidity or oxygen and/or from ultraviolet radiation. This requires the active display elements to be encapsulated.

Most present flat-panel display technologies are based on rigid substrates such as glass. In this case the substrate provides some encapsulation, and encapsulation only needs to be provided to seal the edges of the display where otherwise ingress of atmospheric species would occur. In the case of a flexible display based on plastic substrates the substrate does generally provide inadequate encapsulation because of the high permeability of common plastics to species such as oxygen or moisture. In this case also encapsulation of the front and back surface of the display might be required in addition to a suitable edge seal.

Another problem with flexible display integration is that the edge of the display is susceptible to delamination and peeling of the layers during use, and requires mechanical strengthening to avoid this.

In U.S. Pat. No. 6,923,702 a device display is encapsulated using a stack of a number of barrier layers surrounding the device in order to protect the environmentally sensitive display. It is not necessary to limit the number of barrier layers that are used within the barrier stack, which is dependant on the material of the substrate used, such as the level of permeability of the substrate.

One aim of the present invention is to provide a technique for also encapsulating the driver electronics as well as the display itself.

Another aim of the present invention is to provide a technique that better facilitates achieving the desired protection at the edges of the device as well as at the front and back sides of the device.

The present invention provides a method of encapsulating one or more electronic and/or optoelectronic device elements supported on a substrate, wherein the method comprises applying at least one flexible component to one side of the substrate, bending said least one flexible component about at least one edge of the substrate, and securing said flexible component in such bent configuration.

In one embodiment, the said one or more electronic and/or optoelectronic device elements are provided on a first side of the substrate, and wherein the method comprises applying a flexible component to a second side of the substrate opposite to said first side, bending the flexible component about at least a portion of the substrate so as to overlap at least a portion of said first side of the substrate, and securing said flexible component in said bent configuration.

In one embodiment, the method further comprises forming a barrier over said one or more electronic and/or optoelectronic device elements for protecting the one or more electronic or optoelectronic device elements against damage by oxygen and/or moisture and/or ultraviolet radiation, and wherein the method comprises bending said flexible component about at least said portion of the substrate so as to overlap at least a portion of said barrier over said substrate.

In one embodiment, the method further includes providing a barrier material between the flexible component and the one or more sensitive electronic and/or optoelectronic device elements at a location between the substrate and the barrier formed over said one or more electronic and/or optoelectronic device elements.

In one embodiment, the method comprises applying first and second flexible components to first and second opposite sides of the substrate, bending them about respective edges of the substrate and securing them together in said bent configurations.

In one embodiment, the flexible component or each of the first and second flexible components serves to protect the one or more electronic and/or optoelectronic device elements against damage by oxygen and/or moisture and/or ultraviolet radiation.

In one embodiment, the substrate supports at a location adjacent to the one or more electronic and/or optoelectronic device elements drive electronics for driving the one or more electronic and/or optoelectronic device elements, and the method comprises covering said drive electronics with a housing and securing the housing to an outer side of the at least one flexible component.

In one embodiment, the flexible component or each of the first and second flexible components serves to protect the one or more electronic and/or optoelectronic device elements against damage by oxygen and/or moisture and/or ultraviolet radiation, and wherein securing the housing to an outer side of the at least one flexible component comprises using a sealant that also serves to protect the one or more electronic and/or optoelectronic device elements against damage by oxygen and/or moisture and/or ultraviolet radiation.

The present invention also provides an electronic or optoelectronic device produced by any of the methods described above according to the present invention.

The present invention also provides an electronic or optoelectronic device including one or more electronic and/or optoelectronic device elements supported on a substrate, wherein the one or more electronic and/or optoelectronic device elements are at least partially encapsulated by at least one flexible component secured in a configuration bent about at least one edge of the substrate.

In one embodiment, a flexible encapsulation scheme is used to encapsulate a flexible display module in order to provide structural support for the display module. An upper transparent encapsulation layer covers and protects the media and active area of the device. A lower encapsulation layer is deposited over the under side of the display to complete the encapsulation and the two protective layers are sealed. It is advantageous for the lower encapsulation layer to wrap around the edge in order to fully encapsulate the edge of the device and provide a margin to the display, therefore, increasing the rigidity of this area. In addition, the configuration of this encapsulation scheme reduces the likelihood of display failure through intralayer delamination when the flexible display is being flexed.

In one embodiment, an encapsulating barrier encompasses the device and is sealed in order to protect the device from degradation, mainly due to moisture, but also oxygen. Degradation within the device as a result of the presence of moisture or oxygen could affect the device performance. The encapsulation scheme uses a 'wrap-around' approach to provide flexible edge seals of sufficient mechanical integrity and protection for moisture permeable substrates. The 'wrap-around' approach can also be used to re-enforce any flexible edge seals that are required to further aid the device from, for example, moisture.

In one embodiment, encapsulation layers are wrapped around the device and are sealed by methods, such as heat seals, to provide a monolithic edge, and thereby increase structural stability.

To help understanding of the invention, specific embodiments of the invention will now be described by way of example with reference to the accompanying drawings, in which.

EXAMPLE 1

A method of producing an encapsulated thin film transistor device incorporating an upper material barrier layer and a lower material barrier layer that are sealed together and connected to a driver housing unit.

A lower layer encapsulation barrier is deposited and wrapped around an electronic device and sealed to an upper layer encapsulation barrier in order to protect the device from any degradation effects such as that of moisture or air. In addition, a driver housing unit may be positioned around the encapsulated device and sealed to the upper and lower encapsulation layers to form a water-tight and air-tight housing for the driver electronics of the device.

Figure 1:
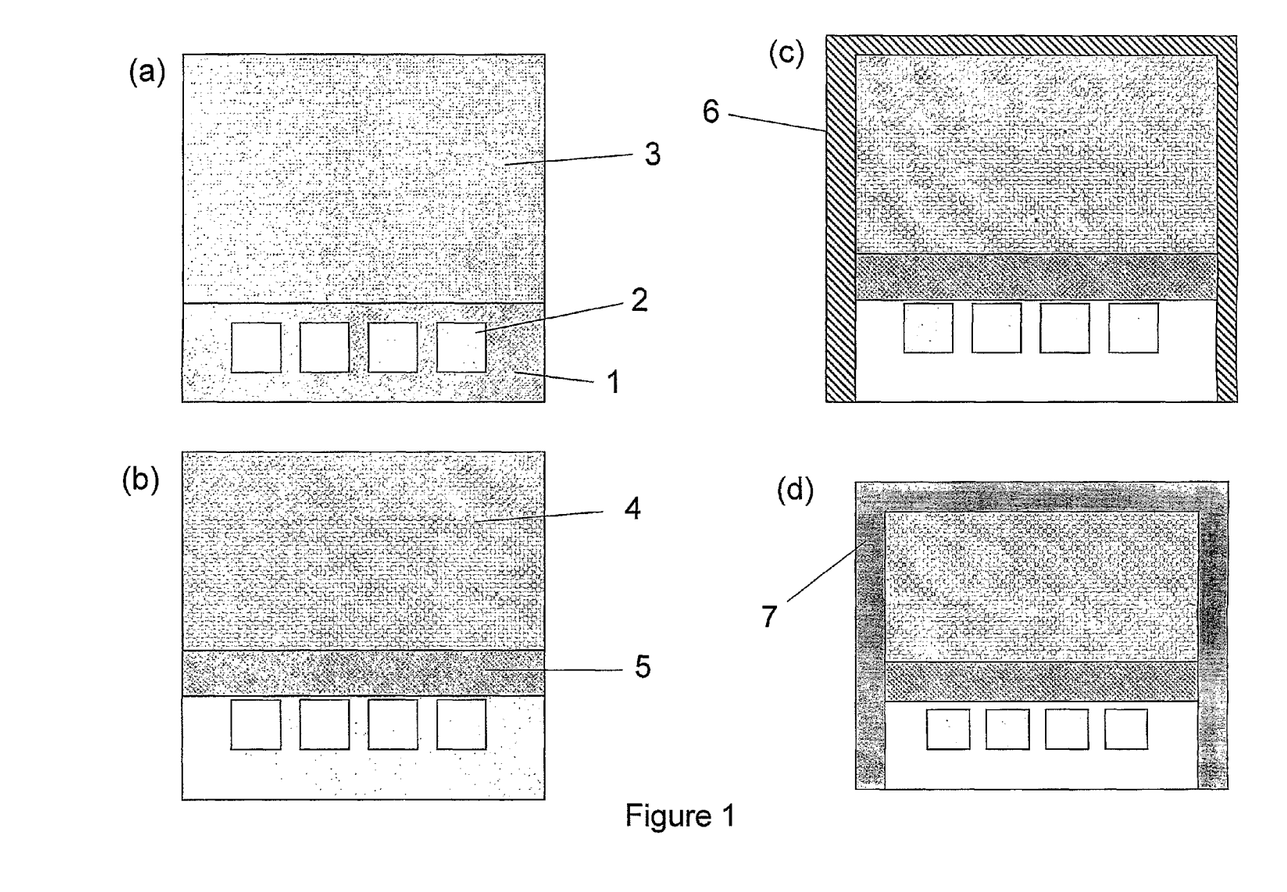
FIG. 1 shows a top view of the process of depositing the upper and lower encapsulating layers to protect a flexible electronic device according to a first embodiment.
Figure 2:
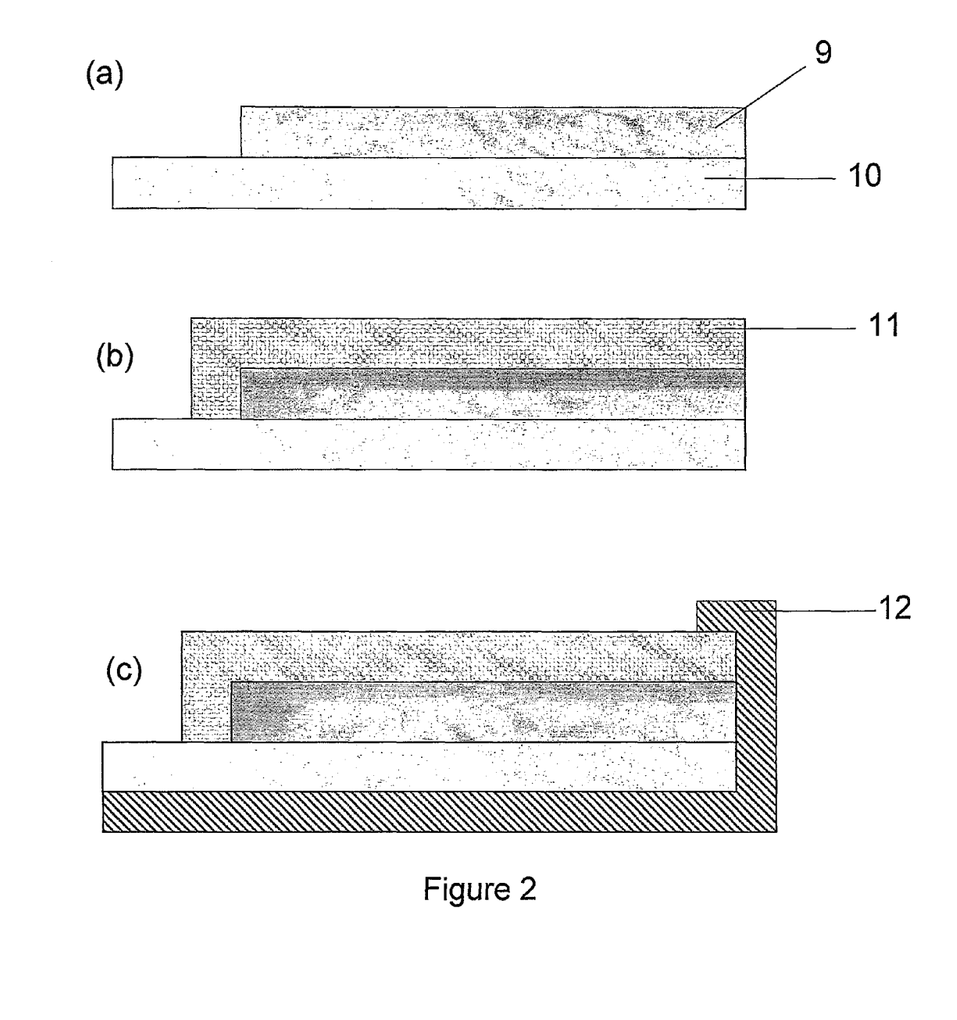
FIG. 2 shows a side view of the process of depositing the upper and lower encapsulating layers to protect a flexible electronic device according to the first embodiment.
Figure 3:
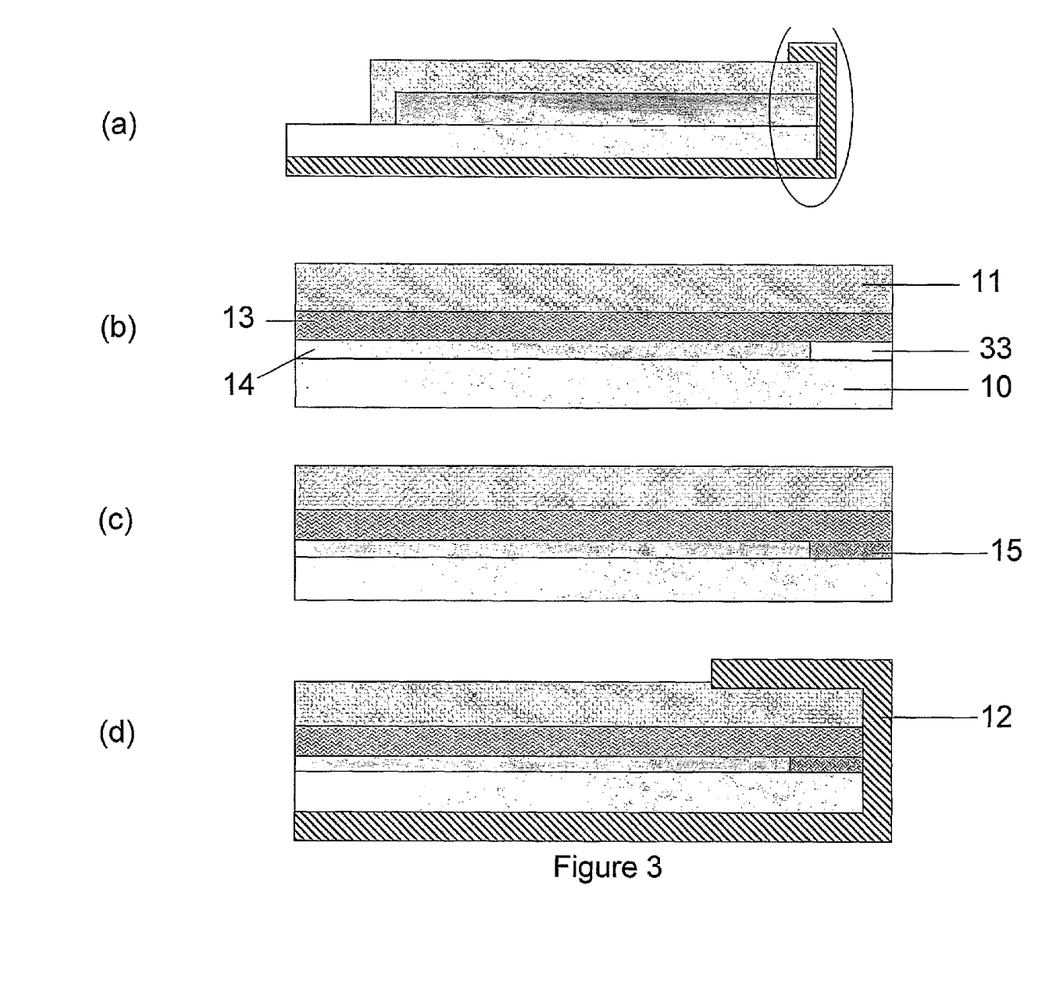
FIG. 3 illustrates a step-by-step process of depositing the upper and lower encapsulating layers according to a variation of the first embodiment.

According to a first embodiment of the present invention, FIGS. 1-3 show the process steps of a method of encapsulation of an electronic device. FIG. 1 shows a top view of a stacked substrate of a thin film transistor device. The display media 3 is shown as being laminated on top of an underlying active matrix backplane and substrate 1. The substrate may be either glass or a polymer film, but preferably a plastic substrate such as polyethyleneterephtalate (PET) or polyethylenenaphtalene (PEN) is used. A thin film transistor stack is deposited over the underlying substrate 1.

A series of tape carrier packages (TCP) 2 and standard driver integrated circuits are connected to the substrate as is shown in FIG. 1 (*a*). The upper barrier layer 5 is then shown in FIG. 1 (*b*) to be deposited over the media layer 4. The flexible display medium is brought in contact with the flexible back plane either through direct deposition of a display active layer, such as an organic light-emitting diode or liquid-crystal display cell, or through lamination with a display medium, such as, but not limited to, an electrophoretic, electrochromic or electronic paper display medium on flexible counter-substrate. The said upper barrier layer should be transparent in order for the underlying display to be visible by the user from the top view. The material of the upper barrier layer should be chosen such that it is impermeable, flexible and compatible with any sealant that may be used. Materials that may be used for the upper transparent barrier include fluoro-polymers, $Al_2O_3$, or a pinhole free stack, such as ITO, $SiO_2$ and SiN. Suitable sealants that may be used include epoxy resins, silicones and acrylic-based adhesives or any sealant that preferably consists of one of the following properties such that it may be U.V. cured or thermally cured or is heat transformable or reflowable. Alternatively, any commercially available adhesive may be used that is curable at less than 160° or most preferably is curable within a range of 80-100°. The barrier layer should be impermeable to any species which is able to degrade the performance of the display device or the TFT, such as high concentration of oxygen or moisture. In addition, the material should be transparent so that underlying display is visible by the user.

Figure 5:
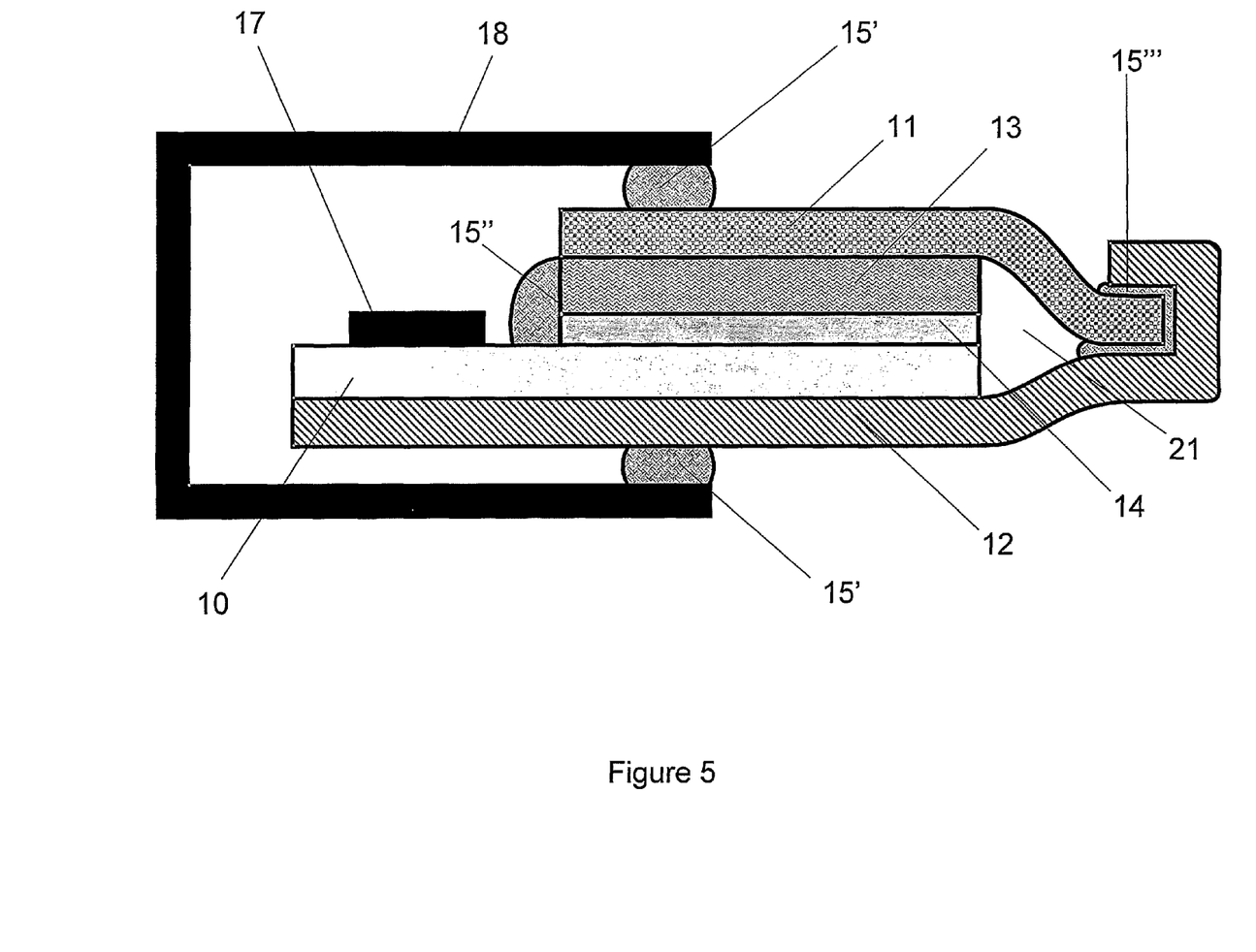
FIG. 5 illustrates a side view of an encapsulation process according to a second embodiment of the present invention showing the lower encapsulation layer wrapped around the upper encapsulation layer and the driver housing.

The use of a sealant within the device is described below and is illustrated in FIGS. 3 (*c*) and 5. A sealant may be used anywhere where there has been a void created, as discussed further below (see FIG. 3 (*b*)) or as a further safeguard in the case of any known or suspected weak areas where moisture or air may enter the device. In the examples described below, the use of a sealant is an optional addition in order to act as a further safeguard.

A further barrier layer 6 is then deposited on the underneath side of the device as is shown in FIG. 1 (*c*). The underlying barrier layer may not necessarily be a transparent material and an opaque thin metal layer would be suitable, or a thin film of an inorganic sputtered material, such as aluminum (Al) In some cases it is preferred that a non-transparent material is used in order to fully cover up the TFTs and ensure a more aesthetically pleasing end result and to protect the TFTs from the negative effects of light. In addition, the underlying barrier layer should also be impermeable. The above described lower barrier layer is wrapped around the upper barrier layer at the edge of the device, as shown, and is then sealed as is illustrated in FIG. 1 (*d*). The lateral thickness of the barrier layers are preferably in the region of 100 μm.

In many cases the material of the substrate (as described above) is permeable (plastic substrates such as PET or PEN, for example, are highly permeable to oxygen and moisture) and so it is therefore necessary for the impermeable barrier layers 11, 12 to fully surround the substrate 10 and the active matrix display in order to prevent moisture and/or other species penetrating into the device and affecting the device performance. It is shown in FIG. 2 that the underlying barrier layer 12 should cover the entirety of the underside of the substrate in order to protect the substrate from degradation, for example, due to moisture. Unlike the upper barrier layer 11, it is not necessary for this layer to consist of transparent material and it may comprise of an opaque layer, such as a thin film of an inexpensive metal, such as aluminum, on a flexible carrier substrate or a thin, free-standing metal foil that would lead to reduced costs.

FIG. 3 shows a step-by-step approach to the above described encapsulation process. The edge of the device is shown in FIG. 3 (a) where the lower barrier layer is wrapped around the upper barrier layer. This section is then enlarged and the process is seen in greater detail in FIG. 3 (b) to (d). It is shown that initially the active matrix of TFTs 14 is formed over the substrate 10. A media layer 13 is seen to be laminated over the underlying active matrix 14. FIGS. 3 (b) and (c) show the deposition of the upper barrier layer 11 as described above and the lower barrier layer is then finally deposited as is shown in FIG. 3 (d).

However, if the lower barrier layer 12 is found to be an insufficient barrier to moisture or air, particularly near the edges of the display, where easy ingress of species into the sensitive active layers is possible, then a void 33 can be formed at the edge of the display as is seen in FIG. 3 (b), prior to the deposition of the lower barrier layer. Part of the display media may be removed in order to form a void. This void may be sealed with a flexible high barrier material sealant 15 in order to ensure that the substrate is fully protected from the effects of degradation, for example, from moisture or oxygen. If a sealant is required, then a void-edge seal may be deposited at the same time as the display media is laminated. Alternatively, the sealant may be deposited as an individual process step if necessary. In addition, in the case, for example, where the display media does not extend the length of the active matrix layer, then the sealant may be positioned between the substrate and the upper encapsulation layer.

Further, it is often the case that voids are formed unintentionally during the process of laminating together the various layers of the device. In this situation, the above described process of filling the voids with a sealant material may also be used both to protect the substrate from the effects of moisture or oxygen and to further prevent any mechanical weaknesses.

After the formation and plugging of the void, the lower encapsulation layer is then wrapped around the device and supports the said sealed void, preventing issues such as delamination or bond failure and therefore increasing the sealant properties of the lower barrier layer. As shown in FIG. 3 (d), the lower barrier layer is wrapped across the bottom of the substrate and up the side wall of the device and then part way across the top of the upper barrier layer. It is important that the lower barrier that overlaps with the upper barrier layer ends before the active area of the display starts. This is particularly the case where the lower barrier layer consists of an opaque material, as this would obstruct the display if it was to be formed over a portion of the display.

Sealing the edge of the display can also be achieved without the use of a void. This method may again utilise a flexible material and also incorporates the process of wrapping the lower encapsulation layer around the device for mechanical integrity and using a heat seal to bond the upper encapsulation layer to the media substrate and the lower encapsulation layer to the underneath of the back-plane substrate to create a monolithic unit with high sealant barrier properties and good mechanical strength.

Figure 4:
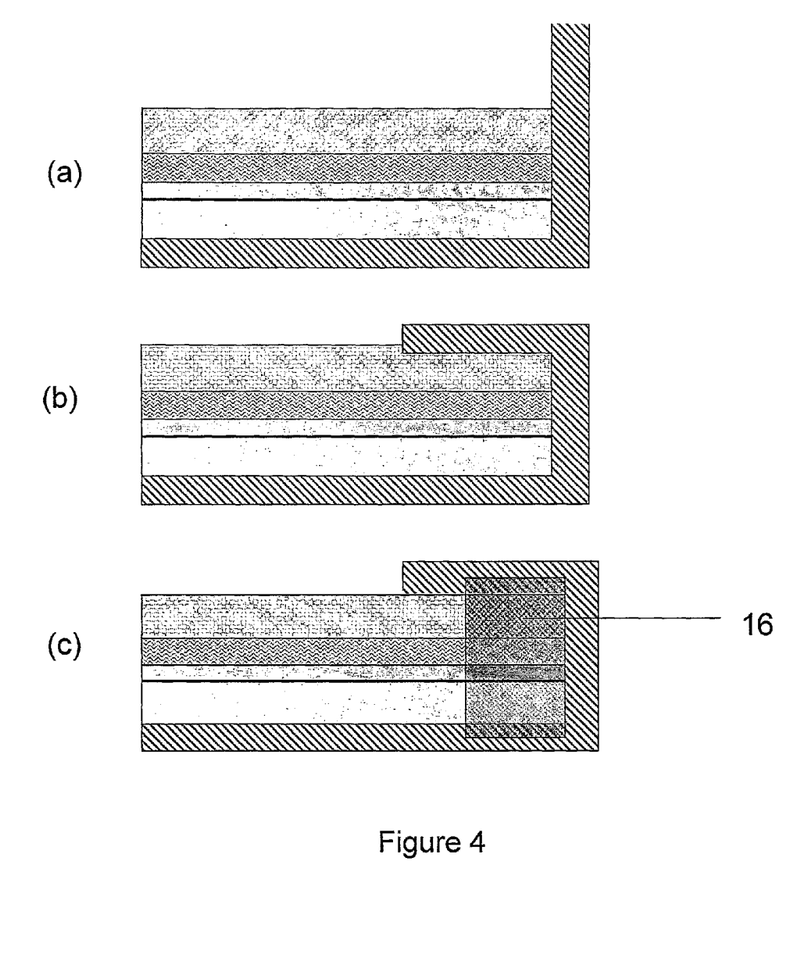
FIG. 4 illustrates a process of heat sealing the encapsulating layers.

Once the lower barrier layer has been deposited around the substrate (see FIG. 4 (a)), the said lower barrier layer is folded and wrapped around the upper barrier layer (see FIG. 4 (b)) and sealed. Preferably, the overlap of the upper and lower barrier layers is preferably less than 10 mm and most preferably between 1 mm to 3 mm or of a distance such that the overlap area does not cover the active area of the display.

A preferred method of sealing the lower barrier layer to the upper barrier layer is by a thermal treatment by melting the barrier layers together to form a heat seal structure monolithic unit as is shown in FIG. 4 (c). Alternatively, a glue may be used in between the upper and lower barrier layers such as a heat curing glue 16.

The area of the device incorporating the TCP's may not specifically require encapsulating if there is no lateral transport of either moisture or air through the device. However, as a further safeguard against the effects of degradation caused by these factors it may be preferable to either extend the transparent encapsulation barrier material used to encapsulate the display over the top of the TCP's (see example 3 below) or create a separate driver housing as is described below in the present example.

If there is no lateral transport of either moisture or air, then a rigid sealant may be used, such as an epoxy sealant. A rigid sealant may be deposited over the edge of the lower transparent barrier material as this area under the driver housing of the TCP's will not be flexed. A sealant may be required in this area in order to provide an air- and moisture-tight finish to the display. The transparent barrier material may then be extended and sealed to the 'wrap around' barrier layers at the bottom of the display under the TCP driver housing.

Situations where the TCP's and driver electronics 17 are preferably housed within a driver housing 18 in order to further protect the driver electronics from the effects of moisture and air, are shown in FIG. 5. The driver electronics include components such as, the application software, data interface, image handling, timing controller and power supply unit. The driver housing is preferably composed of a metallic material which would have the sealant properties necessary to protect the contents from moisture and air, and most preferably, the driver housing is composed of a metal coated plastic material. The areas where the driver housing is in contact with the upper and lower barrier layers may be sealed with a sealant 15' to eliminate the possibility of moisture entering the driver housing and causing any degradation to the substrate. Further sealant 15" may be used inside the driver housing adjacent to the display media and thin film transistors active matrix in between the substrate and upper barrier layer in order to further protect the substrate in the event of any moisture leaking into the driver housing. Sealant 15" may be further used to prevent any mechanical weaknesses occurring, such as the peeling away of any of the laminated layers of the device. In addition, as mentioned above, sealant 15''' may be used in between the upper and lower barrier layers were they meet. It is not necessary for the underlying barrier layer of the device to extend across the underneath of the substrate past the sealant and into the driver housing. However, the lower barrier layer may extend into the driver housing if required to further ensure that no moisture reaches the substrate. It is not necessary, however, to protect the driver electronics themselves with the barrier layers.

In addition to providing sufficient encapsulation of the structure another problem which is solved by the encapsulation techniques described herein is the delamination of layers which can tend to occur during use of the flexible displays. With the encapsulation layer wrapped around the edge of the display it is much more difficult for the layers of the display stack to accidentally peel apart at the edges, and product failures due to delamination are better avoided.

EXAMPLE 2

A method of producing an encapsulated thin film transistor device incorporating an encapsulation layer surrounding the device that is connected to a driver housing unit.

A further embodiment is disclosed according to the present invention, wherein an encapsulation layer is deposited and wrapped around an electronic device and sealed in order to protect the device from any degradation effects such as that of moisture or air. In addition, if required, a driver housing unit may be positioned around the encapsulated device and sealed to the surrounding encapsulation layer to form a water-tight and air-tight housing for the driver electronics of the device.

Figure 6:
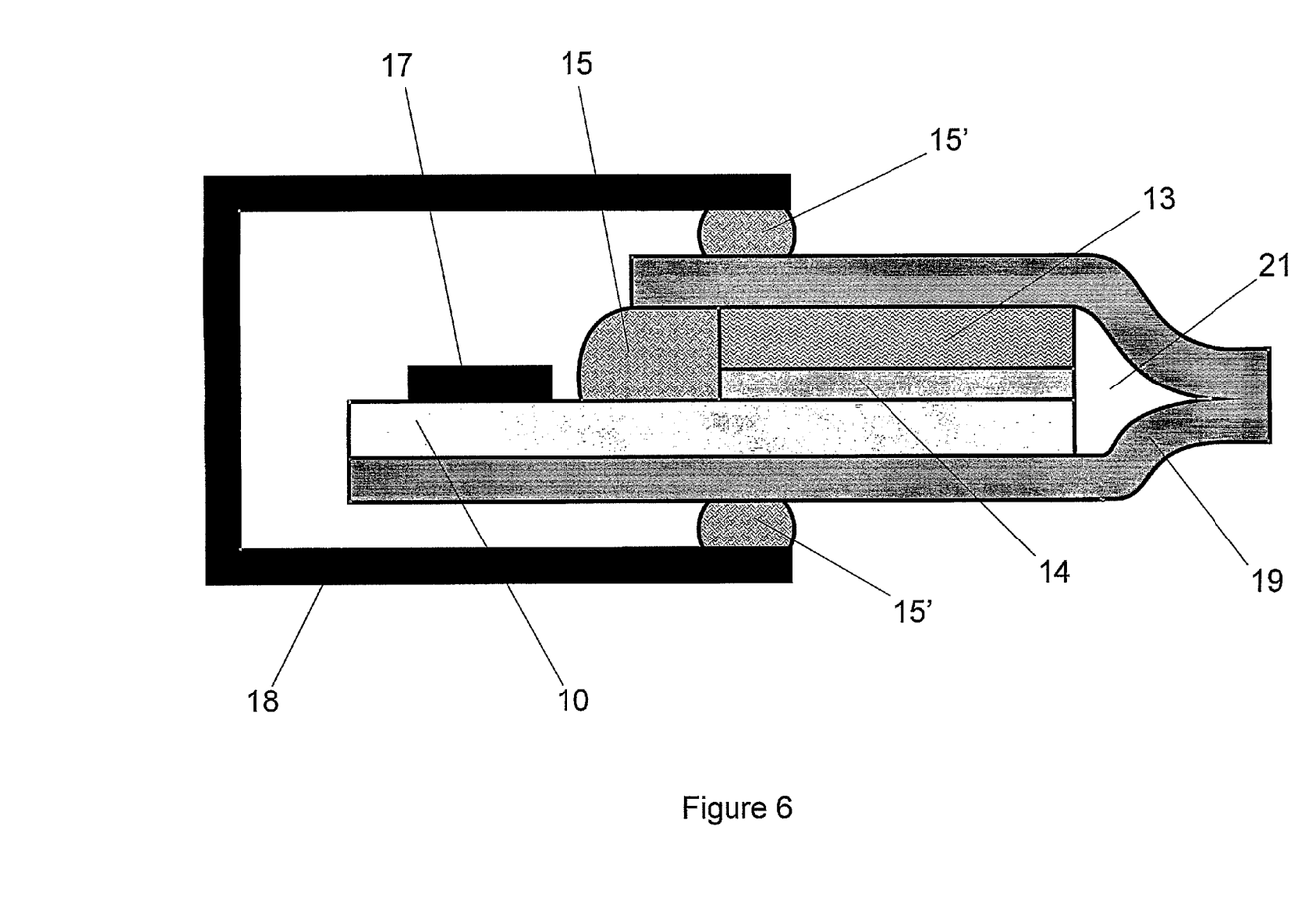
FIG. 6 illustrates a side view of an encapsulation process according to a third embodiment of the present invention showing a single encapsulation layer wrapped around the enclosed flexible electronic device and the driver housing.

This further embodiment of the present invention is represented by FIG. 6. In the present embodiment, the upper and lower barrier layers described above are replaced by a single barrier layer 19 that is wrapped around the stacked substrate to protect the substrate, TFT active matrix and display media as illustrated in FIG. 6. As described above, the driver housing is placed over the barrier layer to protect the driver electronics and then sealant 15' may be used in between the upper barrier layer and the driver housing as well as in between the lower barrier layer and the driver housing.

Alternatively, two individual barrier layers comprising the same material may be used as the upper and lower barrier layers. However, using either a single barrier layer wrapped around the device or using two individual barrier layers of the same material has the disadvantage that it may result in an additional expense of having to use a more expensive transparent material for both barrier layers rather than only for the upper barrier layer.

Figure 7:
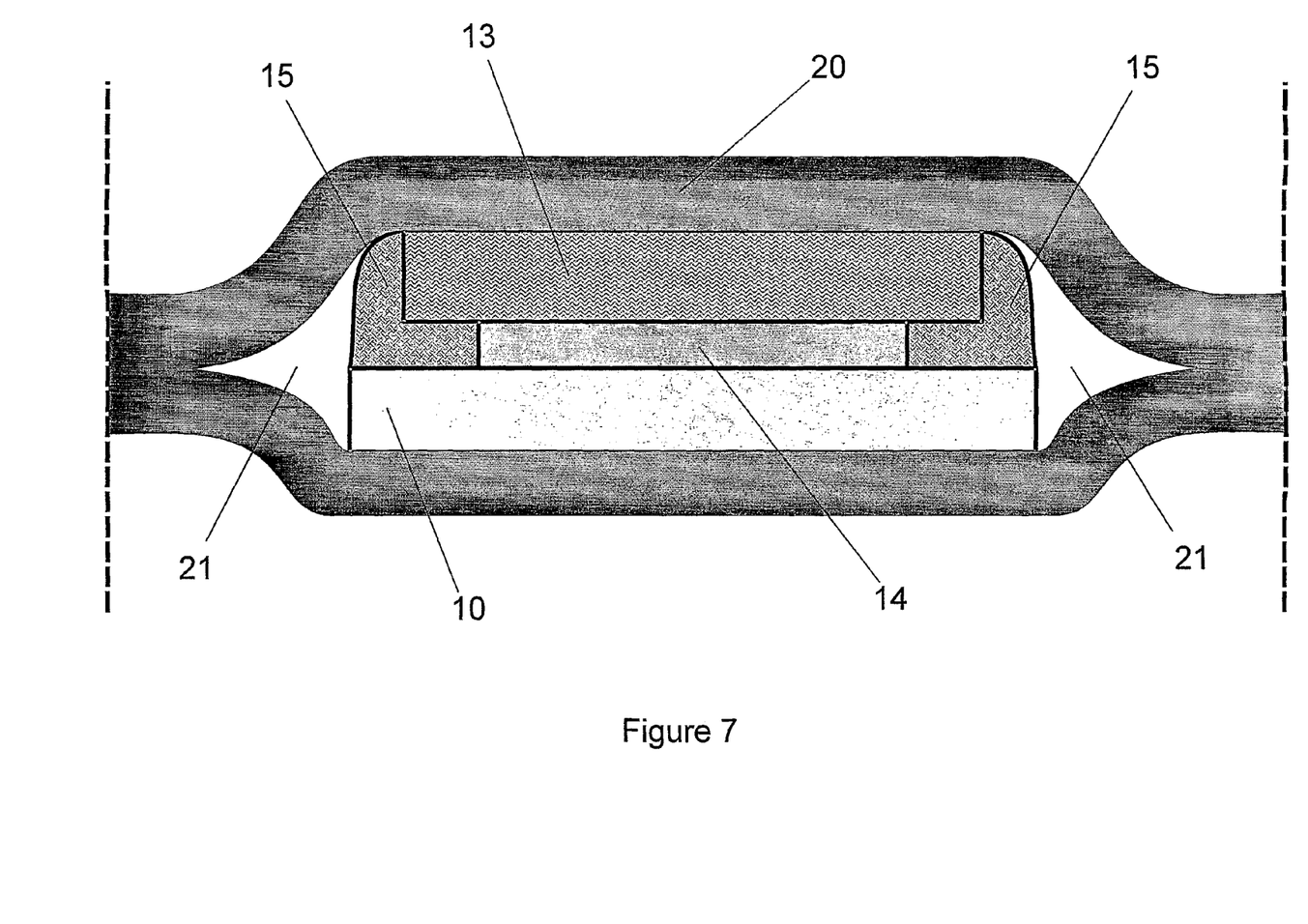
FIG. 7 shows a front view of an encapsulation process according to a fourth embodiment of the present invention showing a single encapsulation layer wrapped around the enclosed flexible electronic device.

FIG. 7 shows a device that has been completely encapsulated by a single barrier layer 20 and this layer may be sealed at the edges with a sealant 15. Voids 21 may be formed at the edges of the device and these are shown in FIGS. 5, 6 and 7. It is preferable that these voids are a vacuum or filled with nitrogen resulting from the device being vacuum-packed or nitrogen-packed under the barrier layers.

The above described techniques further remove the need for a mechanically robust edge sealant, and may remove the need for any specific edge sealant within the flexing part of the display. Additional advantages of the above-described techniques are that they can reduce the complexity and number of processing steps as well as improving the aesthetics of the display module.

With reference to each of the above examples, the bottom edge of the display can be sealed using a rigid barrier material sealant as the TCP area may be clamped, or alternatively, the 'wrap-around' approach may be extended to all four sides of the device, incorporating any external connections required

EXAMPLE 3

A method of producing an encapsulated thin film transistor device incorporating either a single material encapsulation layer or an upper material barrier layer sealed to a lower material barrier layer surrounding the device; a further encapsulation layer may be formed surrounding the driver electronics.

An additional embodiment is disclosed according to the present invention. A single material encapsulation layer or an upper material barrier layer sealed to a lower material barrier layer is deposited and wrapped around an electronic device and sealed in order to protect the device from any degradation effects such as that obtained from moisture or air. In addition, a further encapsulation layer may be formed surrounding the driver electronics and sealed to form a water-tight and air-tight housing for the driver electronics of the device.

Figure 8:
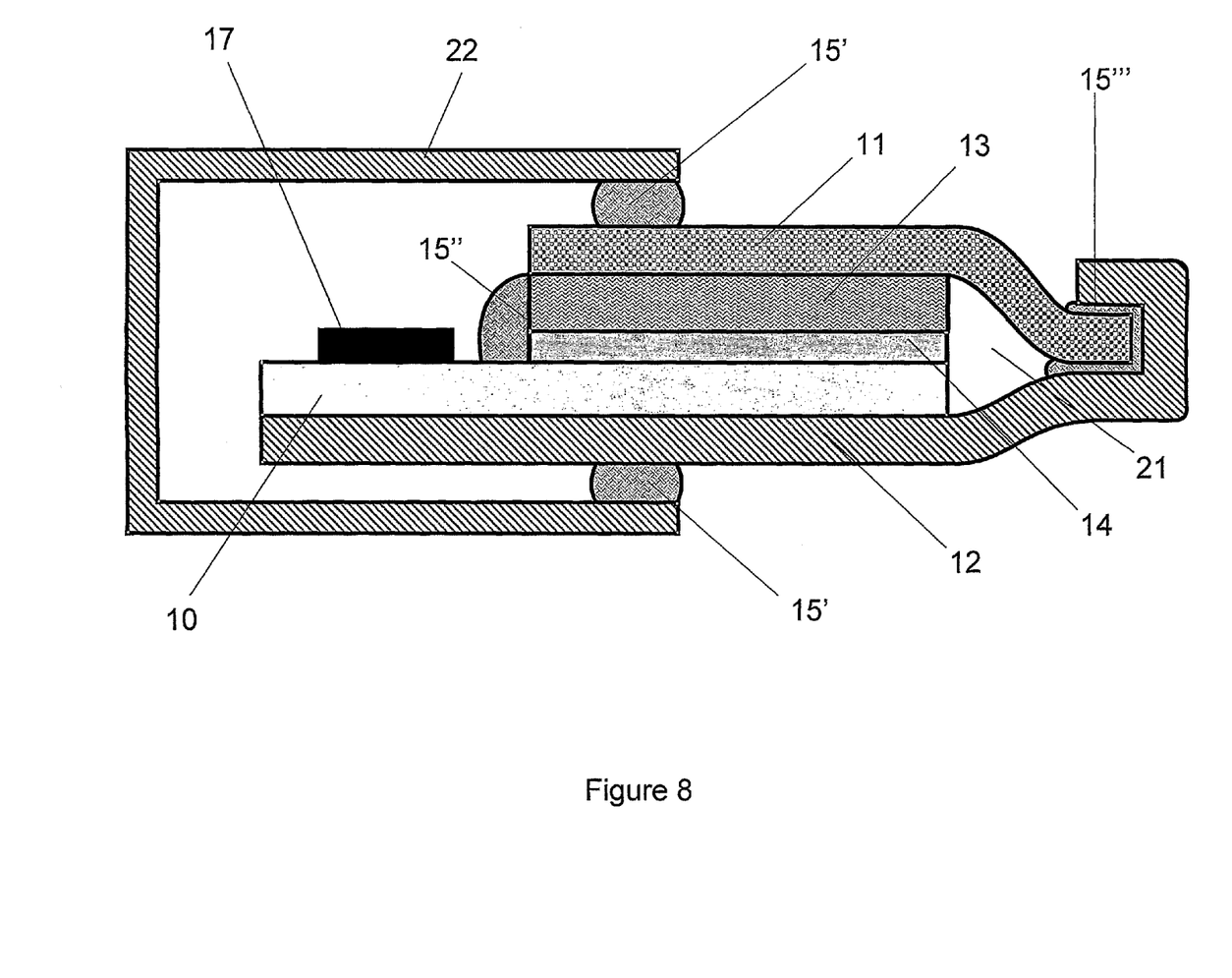
FIG. 8 illustrates a side view of an encapsulation process according to a fifth embodiment of the present invention showing the lower encapsulation layer wrapped around the upper encapsulation layer and a further encapsulation layer surrounding the driver electronics to form a module.

This additional embodiment of the present invention is represented by FIG. 8. In the present embodiment, the above described driver housing is replaced by a further deposited encapsulation layer 22 positioned at the other end of the device from the said overlap region of the aforementioned barrier layers.

Figure 9:
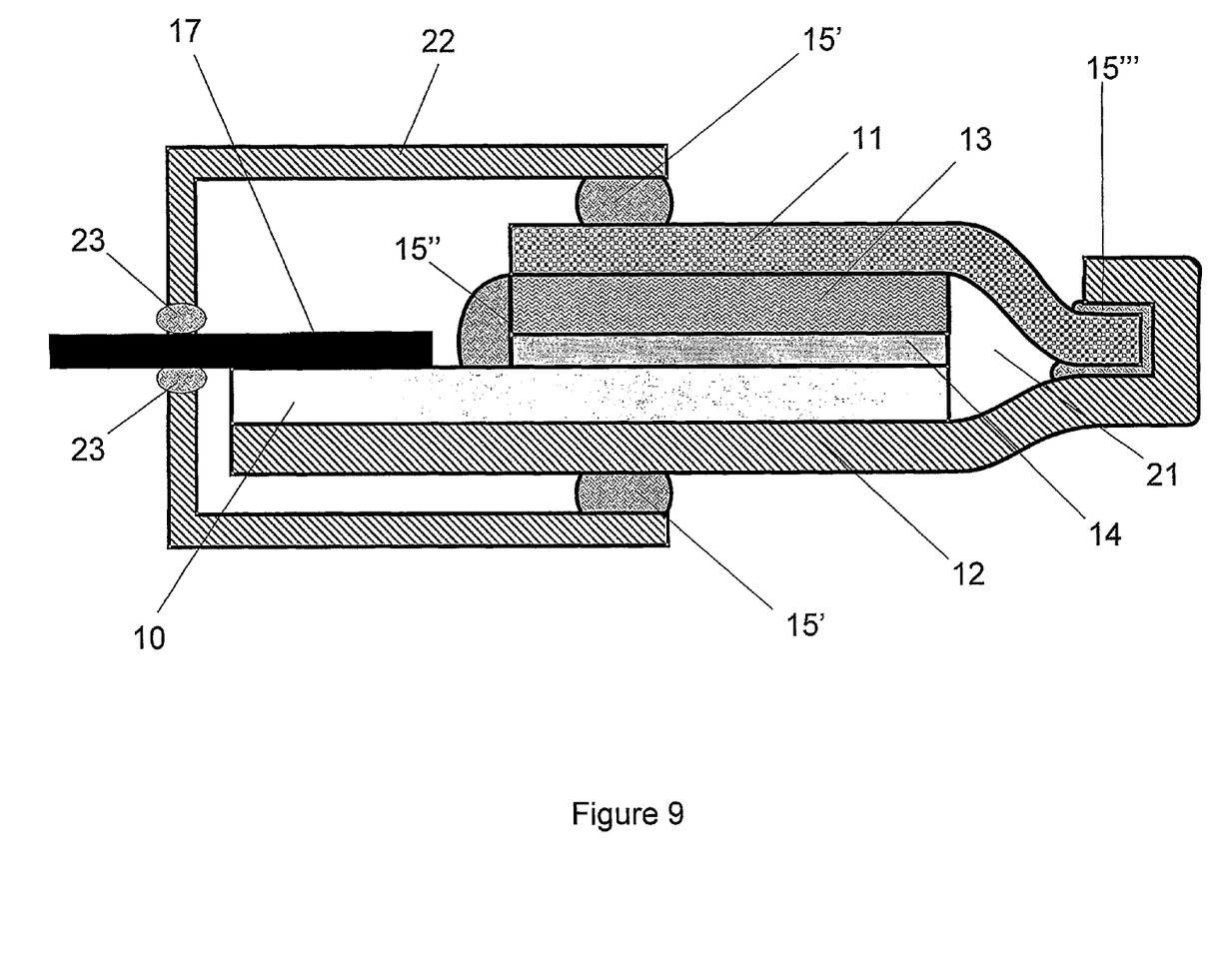
FIG. 9 shows a side view of an encapsulation process according to a sixth embodiment of the present invention with a further encapsulation layer surrounding the driver electronics to form a module and a barrier layer material extending out of the said module.

In this way, the above described encapsulated device now forms a module. The driver electronics connectors are preferably produced from a barrier layer material and extend out of the said module. At the opening between the upper and lower barrier layers where the barrier layer connectors extend out of the module, the upper and lower barrier layers may be sealed with a sealant 23 around the barrier layer connectors resulting in a water-tight and air-tight module, as is illustrated in FIG. 9.

By protecting the driver electronics with the use of a further encapsulation layer in order to create a module, costs could be further reduced due to the costs of the materials used for the said encapsulation layer in comparison with the above described driver housing. Although the application versatility of the module compared with the encapsulated device is reduced as the final module will not be as hard-wearing, further costs could be saved on production of the module.

EXAMPLE 4

A method of producing an encapsulated thin film transistor device incorporating an upper material barrier layer and a lower material barrier layer that are sealed without encapsulating the driver housing unit.

An additional embodiment is disclosed according to the present invention. An upper encapsulation layer is sealed to a lower material barrier layer in order to form an encapsulated module to protect the device from any degradation effects such as that obtained from moisture or air. However, within the present embodiment, there is no need for the driver electronics of the device to also be encapsulated.

Figure 10:
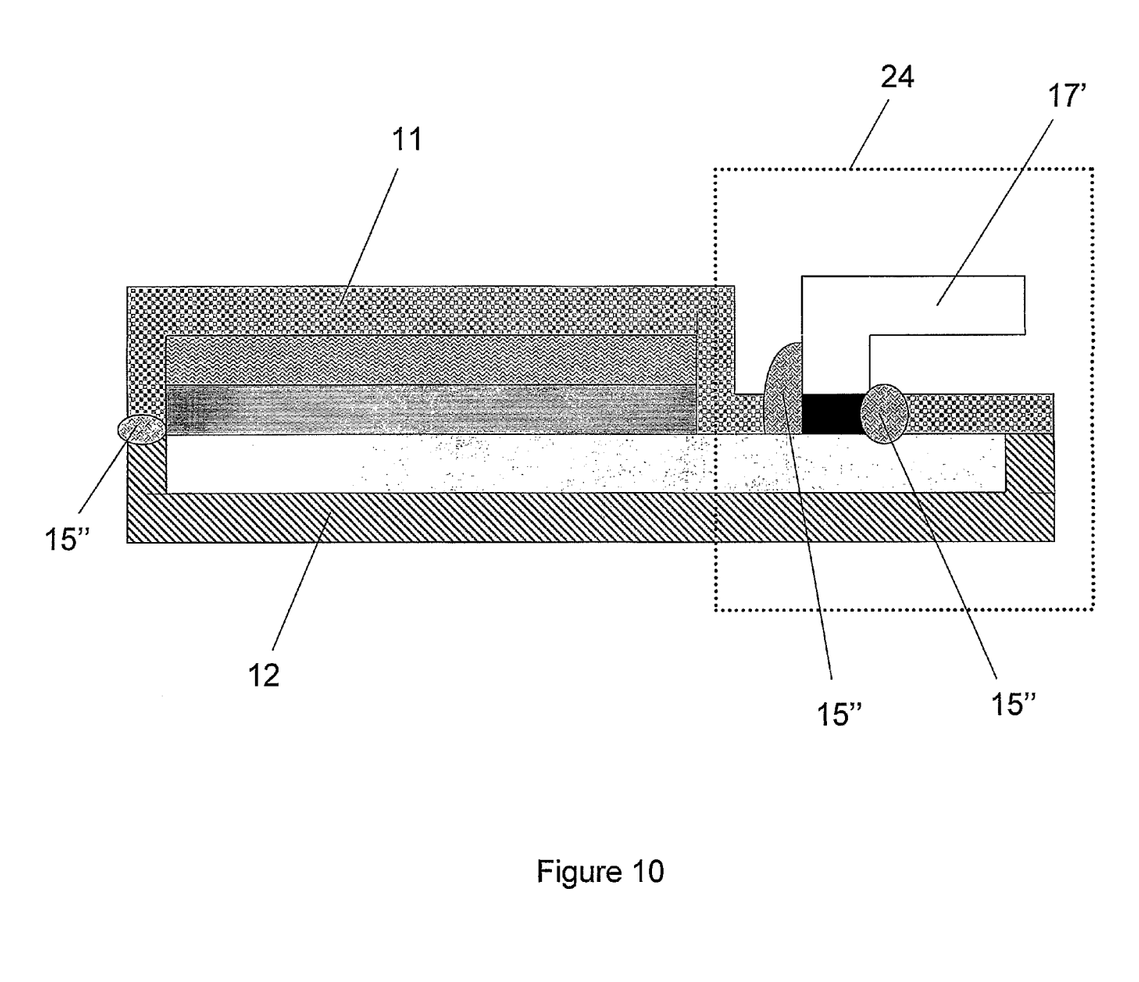
FIG. 10 illustrates a side view of an encapsulation process according to a seventh embodiment of the present invention showing the lower encapsulation layer wrapped around the upper encapsulation layer and enables the use of a driver electronics housing which is not required to be encapsulated.

This further embodiment of the present invention is represented by FIG. 10. In the present embodiment, upper and lower barrier layers are wrapped around the stacked substrate to protect the substrate, TFT active matrix and display media as described above, to form an encapsulated module. However, this embodiment has the added advantage that the driver housing that is placed over the barrier layer to protect the driver electronics, is not required to be encapsulated. A sealant 15" may be used as is illustrated in FIG. 10, and may be positioned in between the upper barrier layer 11 and the TCP's 17' as shown, in order to protect the substrate from degradation, for example, due to moisture.

Figure 11:
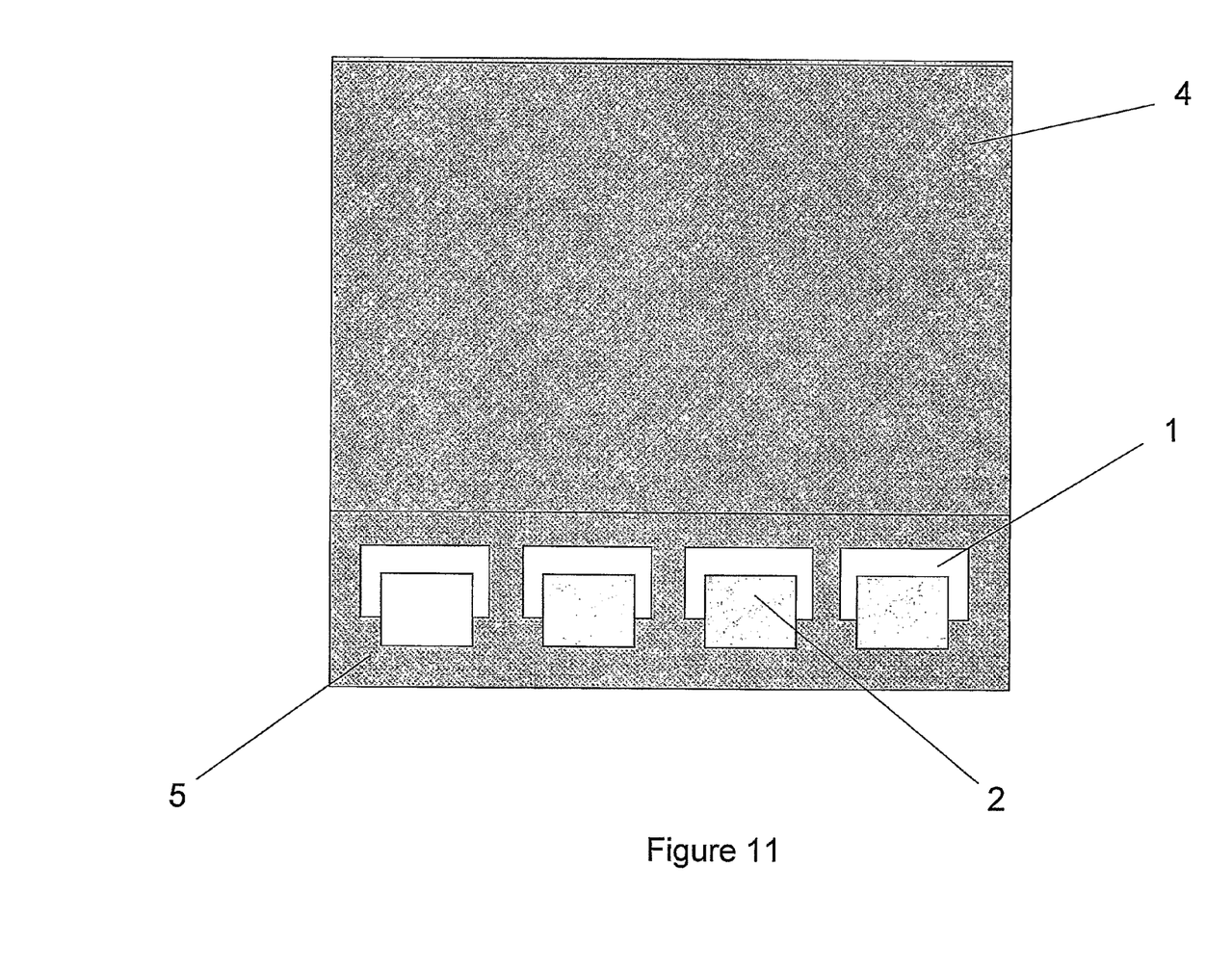
FIG. 11 shows a top view of a stacked substrate of a thin film transistor device produced according to an embodiment of the present invention where the upper barrier layer extends to the end of the substrate, leaving a window area that is free from the barrier material over the TCPs.

FIG. 11 shows a top view of a stacked substrate of a thin film transistor device. The display media is laminated on top of an underlying active matrix backplane and substrate 1, as was previously shown in FIG. 1. However, FIG. 11 shows that in this present embodiment, the upper barrier layer extends 5 to the end of the substrate, leaving a window opening 1 within the encapsulation over the TCP's bonded area. The bonded TCP chips 2 are then able to sit on top of the encapsulation layer, which further prevents damage to the underlying routing. This enables an electronic driver housing to be incorporated into the device, where it is not necessary for the housing to be completely water-tight. However, sealants are provided either side of the TCP's (as is described above) to protect the substrate. In addition, for further protection of the substrate, additional sealants may be used to seal the driver housing to the upper and lower barrier layers.

The processes described within the above described examples have an added advantage of being readily converted to industrial processes using industrial presses in order to heat seal the encapsulated layers together.

In the embodiments described above, one objective is to protect sensitive device elements from degradation by oxygen and/or moisture. However, the present invention is also useful, for example, for protecting sensitive device elements against degradation by ultra-violet radiation.

In each of the above-described embodiments, the sealant and/or the adhesive (used to secure the flexible encapsulation layers to the back and/or front sides of the substrate) may be cross-linked in order to increase the barrier properties thereof against moisture (or oxygen). In addition, the sealant and/or the adhesive may be cross-linked to the substrate to better prevent the ingress of moisture (or oxygen) at the interface between the sealant and/or adhesive and the substrate.

Any of the above examples may be used separately or all together in order to provide the required degree of protection for each individual device. The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of encapsulating one or more electronic and/or optoelectronic device elements supported on a substrate, wherein the method comprises,
   providing a first barrier layer on a first side of the substrate,
   applying a second, flexible single material, barrier layer to a second side of the substrate,
   bending said second, flexible single material, barrier layer about at least one edge of the substrate,
   wrapping said second, flexible single material, barrier layer up side walls of the substrate and around said first barrier layer, and
   sealing the second, flexible single material, barrier layer to the first barrier layer.

2. A method according to claim 1, wherein the said one or more electronic and/or optoelectronic device elements are provided on said first side of the substrate.

3. A method according to claim 2, wherein said first barrier layer protects said one or more electronic and/or optoelectronic device elements against damage by oxygen and/or moisture and/or ultraviolet radiation, and wherein the method comprises bending said second, flexible single material, barrier layer about at least said portion of the substrate so as to overlap at least a portion of said first barrier layer over said substrate.

4. A method of encapsulating one or more electronic and/or optoelectronic device elements supported on a substrate, wherein the method comprises:
   applying at least one flexible component to at least one side of opposite sides of the substrate,
   bending said least one flexible component about at least one edge of the substrate, and
   securing said at least one flexible component in such bent configuration wherein the substrate supports at a location adjacent to the one or more electronic and/or optoelectronic device elements drive electronics for driving the one or more electronic and/or optoelectronic device elements, and the method comprises covering said drive electronics with a housing extending over both said opposite sides of said substrate at at least an edge portion of said substrate and securing the housing to an outer side of the at least one flexible component.

5. A method according to claim 4, wherein said at least one flexible component serves to protect the one or more electronic and/or optoelectronic device elements against damage by oxygen and/or moisture and/or ultraviolet radiation, and wherein securing the housing to an outer side of the at least one flexible component comprises using a sealant that also serves to protect the one or more electronic and/or optoelectronic device elements against damage by oxygen and/or moisture and/or ultraviolet radiation.

6. A method according to claim 4, wherein the driver electronics are not covered by the said at least one flexible component to which the housing is secured.

7. A method of encapsulating one or more electronic and/or optoelectronic device elements supported on a substrate, wherein the method comprises,
   providing a first barrier layer on a first side of the substrate,
   applying a second, flexible, barrier layer to a second side of the substrate,
   bending said second, flexible, barrier layer about at least one edge of the substrate,
   wrapping said second, flexible, barrier layer around opposite surfaces of at least an edge portion of said first barrier layer, and
   sealing the second, flexible, barrier layer to the first barrier layer at both said opposite surfaces of said first barrier layer.

8. A method according to claim 7, wherein the said one or more electronic and/or optoelectronic device elements are provided on said first side of the substrate.

* * * * *